United States Patent [19]

Peterson

[11] Patent Number: 5,258,991
[45] Date of Patent: Nov. 2, 1993

[54] MONOLITHIC LASER DIODE AND MONITOR PHOTODETECTOR

[75] Inventor: David L. Peterson, Pittsford, N.Y.

[73] Assignee: Eastman Kodak Company, Rochester, N.Y.

[21] Appl. No.: 850,607

[22] Filed: Mar. 13, 1992

[51] Int. Cl.$^5$ .............................................. H01S 3/19
[52] U.S. Cl. ...................................... 372/50; 372/48; 372/49; 257/80; 257/85
[58] Field of Search ...................... 372/50, 48, 45, 49; 257/80, 85

[56] References Cited

U.S. PATENT DOCUMENTS

| | | | |
|---|---|---|---|
| 4,470,143 | 9/1984 | Kitamura et al. | 372/50 |
| 4,794,609 | 12/1988 | Hara et al. | 372/50 |
| 5,032,879 | 7/1991 | Buchmann et al. | 372/50 |
| 5,101,246 | 3/1992 | Onodera | 372/50 |

FOREIGN PATENT DOCUMENTS

0410067A1  1/1991  European Pat. Off. .

OTHER PUBLICATIONS

"GaAs:GaAlAs Ridge Waveguide Lasers and Their Monolithic Integration Using the Ion Beam Etching Process", by N. Bouadma et al (IEEE Journal of Quantum Electronics, vol. 25, pp. 2219-2228, Nov., 1989), discussed on p. 2 of the specification.

"An Integrated AlGaAs Two-Beam Laser Diode—Photodiode Array Fabricated with Reactive Ion Beam Etching", by M. Uchida et al (Electronics and Communications in Japan, part 2, vol. 72, pp. 33-43, 1989), discussed on p. 2 of the specification.

"Full-Wafer Technology-A New Approach to Large-Scale Laser Fabrication and Integration", by P. Vettiger et al (IEEE Journal of Quantum Electronics, vol. 27, pp. 1319-1330, Jun., 1991), discussed on p. 3 of the specification.

Primary Examiner—Georgia Y. Epps
Attorney, Agent, or Firm—Raymond L. Owens

[57] ABSTRACT

A monolithic laser diode and monitor photodetector is disclosed wherein the photodetector is placed at a tilt angle $\chi$, within a predetermined range of tilt angles, with respect to the laser diode back facet. The predetermined range of tilt angles is selected according to the thickness and refractive index of the dielectric coating so as to reduce the susceptibility of the photodetector performance to variations in the dielectric coating deposited simultaneously on the output facet of the laser diode and the light collection surface of the photodetector and to significantly reduce the amount of the optical power reflected from the light collection surface of the photodetector onto the laser diode back facet.

5 Claims, 7 Drawing Sheets

MONOLITHIC LASER DIODE AND MONITOR PHOTODETECTOR

FIELD OF THE INVENTION

The present invention relates to devices having a laser diode and monitor photodetector. In particular, it relates to semiconductor structures with integrated laser diode and photodiode, the latter being provided for laser power monitoring.

BACKGROUND OF THE INVENTION

Semiconductor laser diodes are vital components of many communications, data storage and printing systems due to their compact size, performance and compatibility with electronic circuitry.

In order to improve device performance and reduce manufacturing costs, there has been considerable effort aimed towards opto-electronic device integration. An example of these efforts is the integration of laser diodes and monitor photodiodes. The photodiode, facing the back facet of the laser diode, is usually used for monitoring and stabilizing the laser output power. Specially designed photodiodes have also been used to monitor other laser beam characteristics such as the far field intensity distribution.

The following publications and patents are representative of the prior art for integrated laser diode/-photodiode structures:

"Semiconductor Laser Having an Etched Mirror and a Narrow Stripe Width, With an Integrated Photodetector", to M. Kitamura et al (U.S. Pat. No. 4,470,143, September, 1984), describes an integrated laser diode and monitor photodiode which are formed by wet chemical etching of the facets. The facets are both vertical and the stripe width of the photodiode is wider than that of the laser diode in order to improve collection efficiency. The facet of the photodiode may be parallel or angled with respect to that of the laser diode or may have a cylindrical shape.

"GaAs:GaAlAs Ridge Waveguide Lasers and Their Monolithic Integration Using the Ion Beam Etching Process", by N. Bouadma et al (IEEE Journal of Quantum Electronics, vol 25, pp. 2219–2228, November, 1989), describes a laser diode integrated with a monitor photodiode. The vertical and sloped facets of the laser diode and photodiode, respectively, are etched using an ion beam process. The sloped facet of the monitor photodiode reduces the amount of light that is reinjected into the laser.

"An Integrated AlGaAs Two-Beam Laser Diode-Photodiode Array Fabricated with Reactive Ion Beam Etching", by M. Uchida et al (Electronics and Communications in Japan, part 2, vol 72, pp. 33–43, 1989), discusses the fabrication and evaluation of an independently addressable dual laser diode array with monolithically integrated monitor photodiodes associated with each laser diode. The facets of the laser diodes and photodiodes are vertical and parallel to each other and result from reactive ion etching a groove.

"Integrated Semiconductor Diode Laser and Photodiode Structure", to P. L. Buchmann et al (European Patent 0 410 067A1, January, 1991), discloses multiple monitor photodiode structures integrated with a laser diode, both devices with vertical facets. The various structures discussed, including those with a monitor photodiode at each laser facet, are used primarily for wafer scale testing. In particular, the facets of the monitor photodiodes are shaped to enhance their sensitivity to transverse mode changes in the laser diode.

"Full-Wafer Technology—A New Approach to Large-Scale Laser Fabrication and Integration", by P. Vettiger et al (IEEE Journal of Quantum Electronics, vol 27, pp. 1319–1330, June, 1991), describes wafer scale fabrication and testing of monolithically integrated laser diodes and monitor photodiodes. The device facets are formed by chemically assisted ion beam etching (CAIBE) with both the laser diode and photodiode facets perpendicular to the wafer surface. The facet of the monitor photodiode is placed at an unspecified angle with respect to the laser diode facet. In this work, the output facet of the laser diode received a low reflectivity coating while the back facet received a high reflectivity coating. The low reflectivity coating is also deposited on the light collection surface of the monitor photodiode.

As described above, in order to fabricated useful laser diodes, dielectric coatings are applied to both the output and back facets of the laser diode to adjust their respective reflectivities and, hence, the ratio of the powers emitted at each facet. Altering the facet reflectivities may also affect some performance parameters of the device such as the threshold current and differential quantum efficiency. An additional benefit of depositing dielectric coatings on the facets is that these films passivate the exposed semiconductor surface and, hence, improve device reliability. Depositing the dielectric coating to the monolithic laser diode/monitor photodiode structure results in the output facet coating material being deposited simultaneously on the light collection surface of the monitor photodetector. Due to variability in the fabrication process, the dielectric coating will exhibit variations in both thickness and composition. This variability will, in turn, lead to variations in the resulting facet relectivities and, hence, to variations in laser diode performance. In addition, the varying properties of the dielectric coating will also affect the monitor photodetector performance in altering the reflectivity of the light collection surface and, hence, its power detection efficiency.

SUMMARY OF THE INVENTION

It is the object of this invention to reduce the susceptibility of the monitor photodetector performance to variations in the dielectric coating deposited simultaneously on the laser diode output facet and the light detecting surface of the monitor photodiode. This reduction is accomplished by placing the photodetector at an appropriate angle with respect to the laser diode back facet. This preferred angle is determined by the optical waveguide structure of the laser diode and the optical properties of the deposited dielectric film.

DETAILED DESCRIPTION OF THE INVENTION

Figure 1:
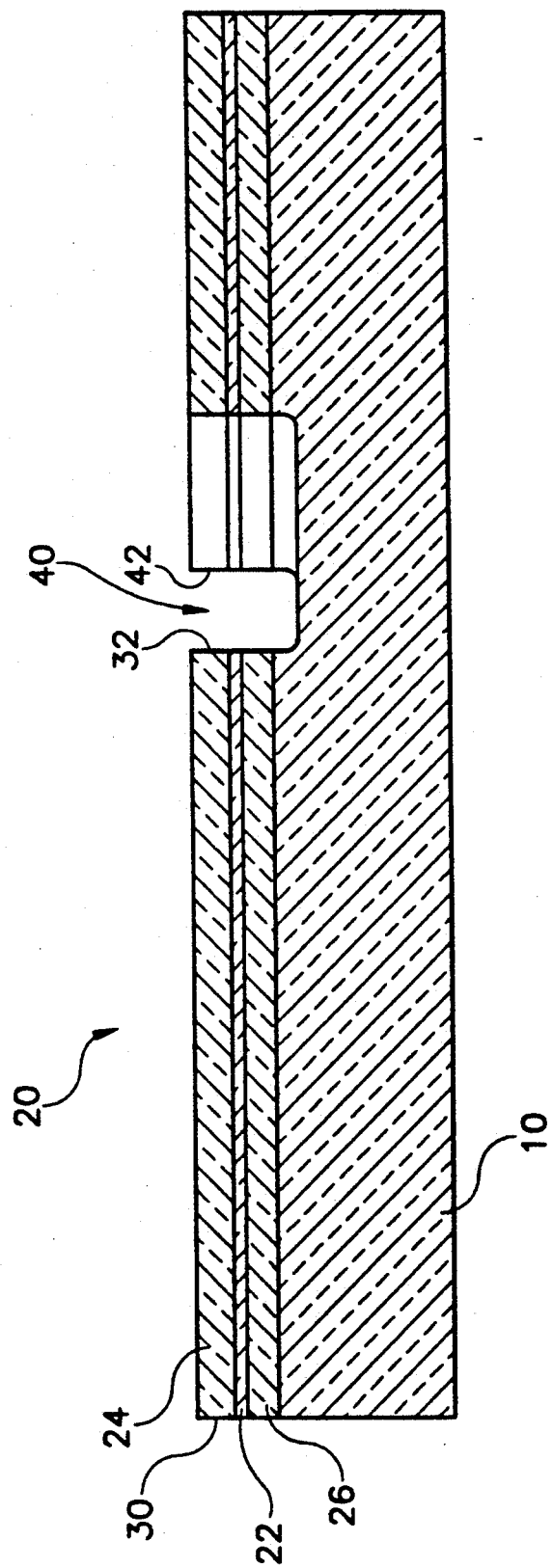
FIG. 1 is a schematic cross sectional view of an integrated laser diode/monitor photodiode structure.

A cross sectional view of an integrated laser diode (LD) and monitor photodiode (MPD) is shown in FIG. 1. A semiconductor laser diode 20 and monitor photodiode 30 are fabricated monolithically on a semiconductor substrate 10. The laser diode may be of any conventional structure appearing in the prior art and, for the simplicity, only the active layer 22, the upper cladding layer 24 and lower cladding layer 26 are shown as being representative of the more complete epitaxial structure. The prior art contains examples in which the epitaxial structure of the monitor photodiode is identical to as well as different from that of the laser diode. In addition, the dielectric and metal layers necessary for fabricating the structure and obtaining electrical contact are not shown. For purposes of illustration only, a ridge waveguide structure is shown. The laser diode also has the output facet 30 and the back facet 32. Fabricated on the substrate 10 in close proximity to the laser diode 20 is the monitor photodetector 40 with a light collection surface 42 oriented towards the laser diode back facet 32. The back facet 32 and the photodiode light collection surface 42 are substantially perpendicular to the plane of the substrate and are fabricated by etching a recessed region into the epitaxial material. The preferable etching technique would be CAIBE. The output facet of the laser diode 30 is formed either by etching or cleaving along crystallographic planes.

Figure 2:
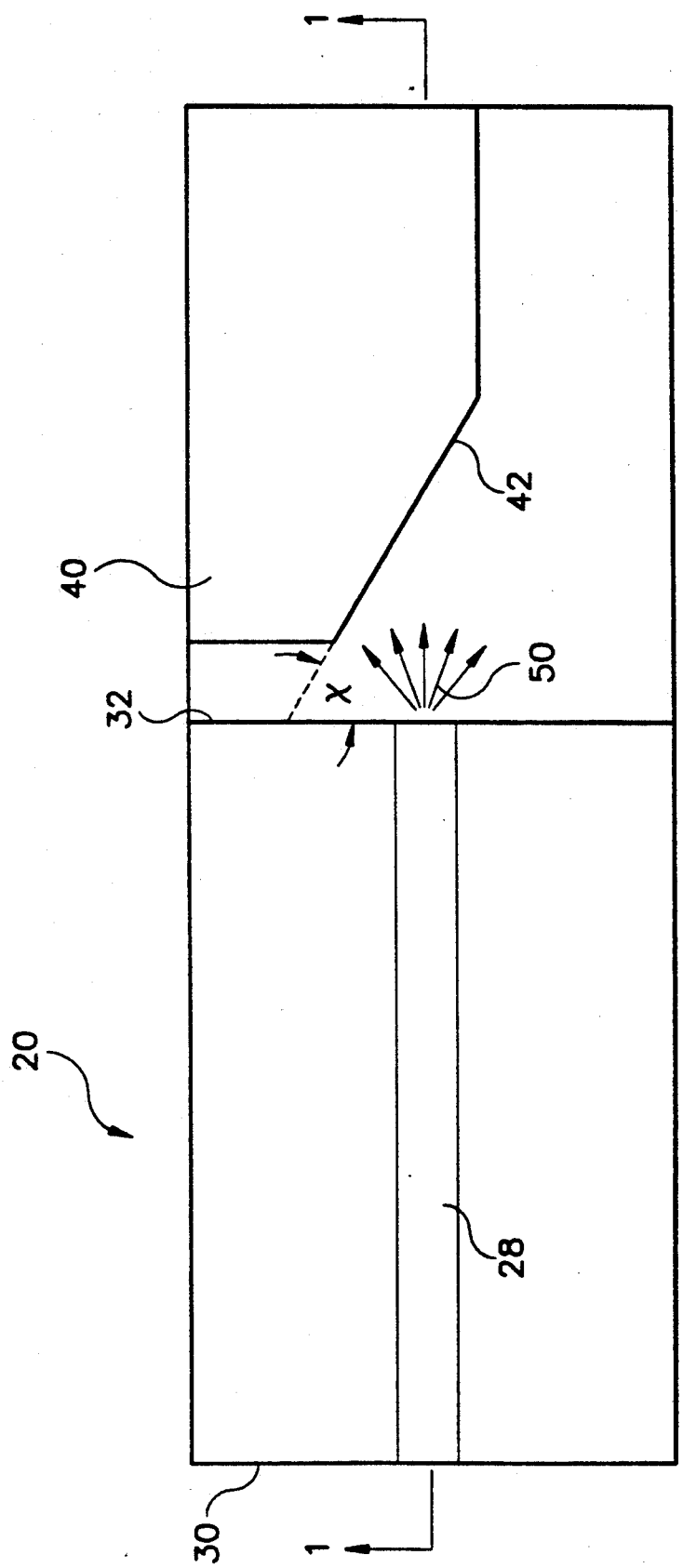
FIG. 2 is a schematic top view of the structure of FIG. 1.

Referring to FIG. 2, a top view of the integrated laser diode and monitor photodiode structure, there is a smaller region 28 within the larger body of the laser diode in which electrical carrier injection and, for index-guided structures, lateral optical waveguiding is accomplished and subsequent light emission is obtained. In this example of a ridge waveguide laser diode, the region 28 is the ridge waveguide. The light collection surface of the monitor photodetector 42 is fabricated at a tilt angle χ with respect to the laser diode back facet 32 and placed with respect to the light emitting region 28 such that a large fraction of the light emitted from the back facet of laser diode, represented by arrows 50, is incident upon the light collection surface 42. In the prior art, the tilt angle χ has ranged from 0°, in which the light collection surface 42 is parallel to the back facet 32, to the Brewter's angle, usually in excess of 70° for conventional semiconductor laser diode materials. In the prior art, there are a variety of photodiode structures, in which the photodiode may have additional optical waveguiding or the epitaxial structure may differ from that of the laser diode to provide increased photodiode sensitivity. This invention is not limited to the overall shape and structure of the photodiode, but rather pertains to the light collection surface 42 and its placement with respect to the laser diode. Prior art arrangements provide for the efficient absorption of the light transmitted through the light collection surface.

Figure 3:
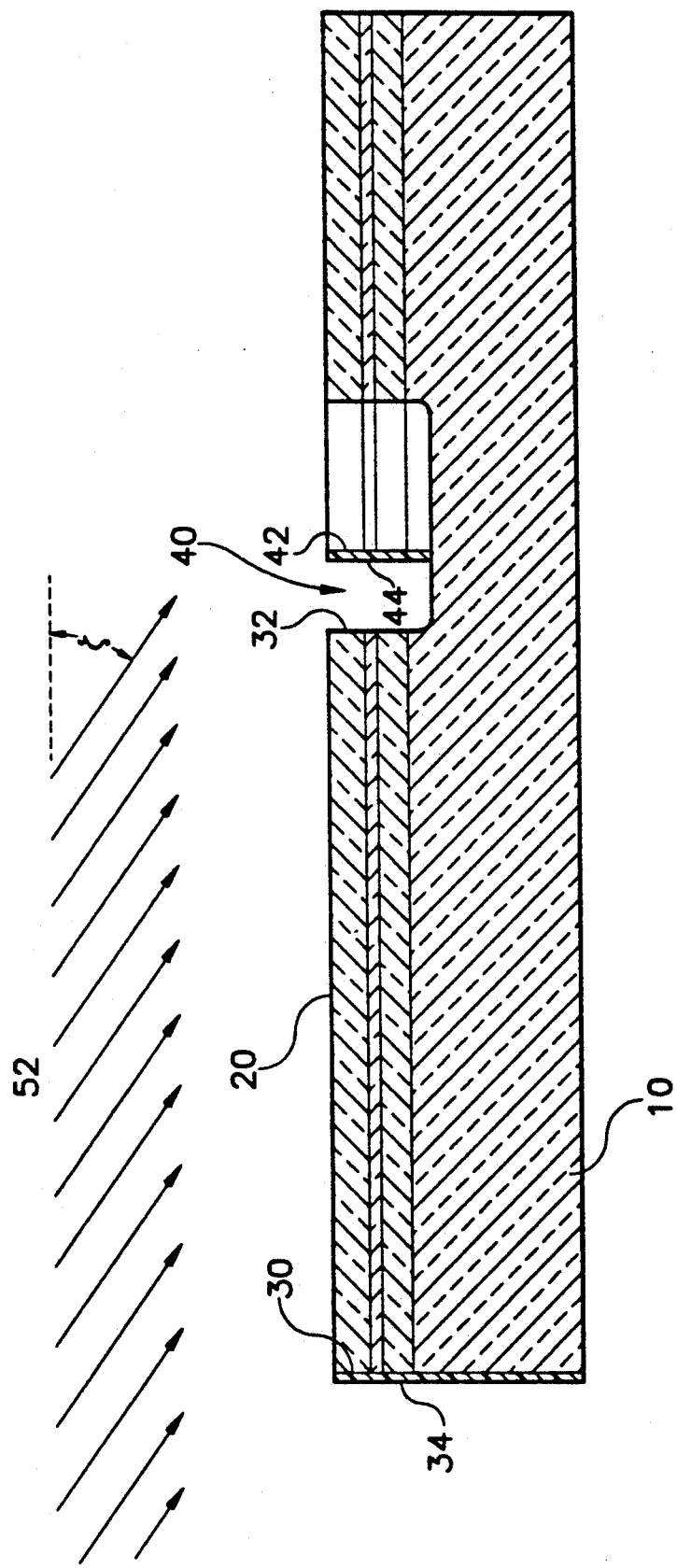
FIG. 3 is a schematic cross sectional view of the structure of FIG. 1 showing the simultaneous deposition of dielectric films to the laser diode output facet and the monitor photodiode light collection surface.

Once the facets of the laser diode 30 and 32 and the light collection surface 42 of the monitor photodiode are formed it is customary to apply a dielectric coating 34 to the output facet 30 of the laser diode as is shown in cross section in FIG. 3. The purpose of this coating is to passivate the semiconductor surface, serving as a barrier to the environment and improving device reliability, and to alter the facet reflectivity to obtain desired laser diode performance characteristics. A common practice is to lower the output facet reflectivity by depositing a single dielectric film of appropriate refractive index and thickness in order to achieve low reflectivity (LR) or anti-reflectivity (AR) and, hence, increase the ratio of optical power emitted from the output facet relative to that emitted from the back facet. (It is also a common practice to apply a set of thin films (HR) to the back facet in order to increase relectivity of this facet and decrease the fraction of light emitted at this facet.

Most LR films are fabricated by depositing a single dielectric, such as silicon dioxide, aluminum oxide or silicon nitride, and adjust the film thickness to achieve the desired reflectivity. A value of 10% for the desired output facet reflectivity would be typical. The process of depositing the dielectric film unto the monolithic laser diode/monitor photodiode is shown in FIG. 3 with the flux of dielectric material being represented by the arrows 52. The flux 52 is at an angle ξ with respect to the plane of the device. The deposition angle ξ will in general be greater than 0°, particularly if the laser diode/monitor photodiode device is part of a larger structure such as a wafer and the output facet 30 has been formed by etching. In order to control the thickness of the dielectric film 34, the projection of the flux vector, represented by 52, unto the plane of the device will be substantially parallel to the longitudinal axis of the laser diode and perpendicular to the output facet 30. During the deposition of the dielectric film 34, the dielectric film 44 will be simultaneously deposited on the light collection surface 42. The thickness of the film 44 is given by $h = h_o \cos \chi$, where $h_o$ is the thickness of the film 34 on the output facet which is determined from the refractive index of the film and the desired output facet reflectivity. The thickness h of the film 42 on the light collection surface is subsequently determined by the tilt angle χ at which this surface is placed with respect to laser diode back facet 32. Since the optical thickness, equal to the product of the refractive index and the thickness, of the film 34 determines the output facet reflectivity, variations in its refractive index or thickness (due to unavoidable fabrication variability) will result in significant variations in the performance of the laser diode. The film 44 on the light collection surface will vary in refractive index and thickness as well.

In accordance with this invention a range of tilt angles χ can be determined for which variations in the deposited dielectric film has a minimal effect on the performance of the monitor photodiode. One advantage is that the monitor photodetector can then be used in the characterization of the more sensitive laser diode.

The following discussion is example of one way to model the performance of the integrated laser diode/monitor photodiode structure to determine the range of tilt angles of interest. During the course of constructing the model, some approximations are made in order to simplify the necessary calculations. The errors introduced by these approximations should primarily affect the magnitude of the signal generated at the monitor photodetector and have only an inconsequential affect on the results of the sensitivity analysis.

As is the case for conventional laser diodes, the polarization of the light emitted from the LD back facet is assumed to be parallel to the epitaxial layers of the device and lie in the plane of incidence to the MPD. For this p-polarization the transmission coefficient from one optical medium into another is given by the familiar expression $$t_p = \frac{2n_i \cos\theta_i}{n_t \cos\theta_i + n_i \cos\theta_t}$$

where $n_i$ and $n_t$ are the refractive indices of the incident and transmittent media, respectively, and $\theta_i$ and $\theta_t$ are the angles of incidence and transmittance related by Snell's law. For the case of light propagating from medium $n_1$ through a dielectric film of thickness h and refractive index $n_2$ into a semi-infinite medium of refractive index $n_3$, the transmissivity is $$T_p = \frac{n_3 \cos\theta_3}{n_1 \cos\theta_1} \frac{t_{12}^2 t_{23}^2}{1 + r_{12}^2 r_{23}^2 + 2r_{12}r_{23}\cos 2\beta}$$

where $$\beta = \frac{2\pi}{\lambda_0} n_2 h \cos\theta_2$$

and $$r_p = \frac{n_i \cos\theta_i - n_t \cos\theta_t}{n_i \cos\theta_i + n_t \cos\theta_t}$$

is the reflection coefficient for p-polarization and applies, as does $t_p$, at each interface (12 and 23).

Although the optical near field at the facet extends to several microns in the lateral direction, the output at the laser diode back facet is approximated as a point source with a Gaussian form to the angular divergence in both the transverse and lateral directions with the consequence that the optical output from the LD arrives at the MPD with a distribution of incident angles.

Figure 4:
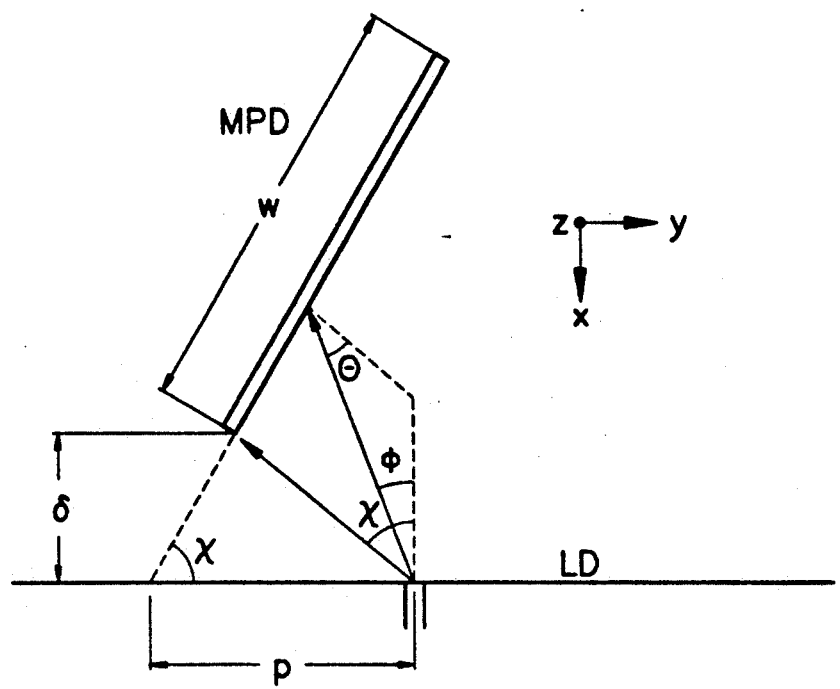
FIG. 4 is a schematic diagram showing the relationship between the monitor photodiode tilt angle $\chi$, the angle of incidence θ at the light collection surface and the emission angle φ from the laser diode back facet.

A magnified view of the integrated laser diode/monitor photodiode structure is given in FIG. 4. For consistency in the modelling calculations, the nearest corner is placed at the tilt angle $\chi$ as measured from the normal at the center of the LD facet and at a distance from the corner to the LD back facet, $\delta$, that is held constant to an appropriate fabrication feature size of 5 $\mu$m. These two arbitrary design constraints allow the selection of the MPD tilt angle $\chi$ and the light collection surface width w to completely define the placement and orientation of the monitor photodiode and the light collection surface. The relationship of the lateral emission angle $\phi$ from the LD back facet, the angle of incidence at the MPD light collection surface $\theta$ and the MPD tilt angle $\chi$ is illustrated in FIG. 4. In the plane of the figure (lateral plane), the intensity of the emitted radiation as a Gaussian function of the angle $\phi$ is given by $$I_l(\phi) = \sqrt{\frac{1}{2\pi\phi^2}} \exp\left(-\frac{\phi^2}{2\sigma_\phi^2}\right)$$

where $\sigma_\phi$ determines the extent of beam divergence. It should be noted that $\sigma_\phi \approx 0.425 \Delta\phi$, where $\Delta\phi$ is the angular full width at half the maximum intensity. The distance from the center of the LD back facet to the MPD light collection surface for light emitted at an angle $\phi$ is given by $$d(\phi,\chi) = \frac{p(\chi)}{\cos\phi \left(\tan\left[\frac{\pi}{2} - \chi\right] + \tan\phi\right)}$$

where $p(\chi)$ is the distance from the center of the LD back facet to the pivot point of the MPD light collection surface. This distance is given by the expression $$p(\chi) = \frac{\delta}{\sin\chi\cos\chi}$$

where $\delta$ is the fixed separation between the LD back facet and the nearest edge of the MPD light collection surface.

Figure 5:
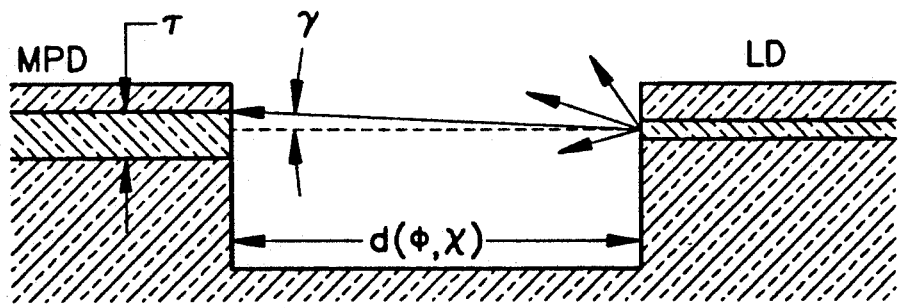
FIG. 5 is a cross sectional view of the structure of FIG. 1 showing the relationship of the monitor photodiode waveguide thickness τ, the maximum transverse acceptance angle γ and the emission angle dependent distance d from the laser diode back facet to the light collection surface.

A more detailed cross sectional (lateral) view of the integrated laser diode/monitor photodiode is shown in FIG. 5. It is assumed that the MPD, being of the same waveguide structure, will have a limited region, designated by $\tau$ and centered about the LD active layer, in which light is absorbed. (For these calculations, the effective waveguide thickness $\tau$ is set to 1 $\mu$m. Changing the effective absorption by changing $\tau$ would affect only the MPD signal magnitudes not their sensitivity to fabrication variability.) The calculations that follow assume that the light transmitted into the detector within the waveguide layer is completely absorbed while that outside this layer does not contribute to the MPD signal. Also, the angle $\gamma$, which defines the maximum transverse angle for MPD collection, is small enough for the approximation that all the incident light at the light collection surface is p-polarized to be valid. Similarly, the normalized intensity distribution in the transverse direction is given by $$I_t(\alpha) = \sqrt{\frac{1}{2\pi\alpha^2}} \exp\left(-\frac{\alpha^2}{2\sigma_\alpha^2}\right)$$

The functional dependence of the maximum transverse MPD collection angle, $\gamma$, on $\phi$ and $\chi$ is given by $$\gamma(\phi,\chi) = \tan^{-1}\left(\frac{\tau}{2d(\phi,\chi)}\right)$$

The transverse fraction of the intensity absorbed by the MPD is given by $$f_l(\phi,\chi) = \sqrt{\frac{1}{2\pi}} \int_{-x}^{x} e^{-t^2/2} dt \simeq x\sqrt{\frac{2}{\pi}}\left(1 - \frac{x^2}{6}\right)$$

where $$x = \frac{\gamma(\phi,\chi)}{\sigma_a}$$

The total MPD signal is the product of the transverse and lateral intensity functions with the light collection surface transmissivity integrated over the angular extent of the MPD light collection surface. The expression $$S(\chi) = \int_w I_t(\phi) f_l(\phi, \chi) T_p(\phi, \chi) d\phi$$

is referred to as the MPD signal magnitude and can be interpreted as the fraction of the total LD power emitted from the back facet that is collected by the MPD. The important approximations of this model are that the LD is modelled as a point source emitting a beam with a Gaussian angular divergence and that the MPD can be treated as a simplistic waveguide absorber. Errors due to these approximations should affect only the absolute values of the MPD signal magnitudes and have little influence on the MPD signal sensitivity results.

Figure 6:
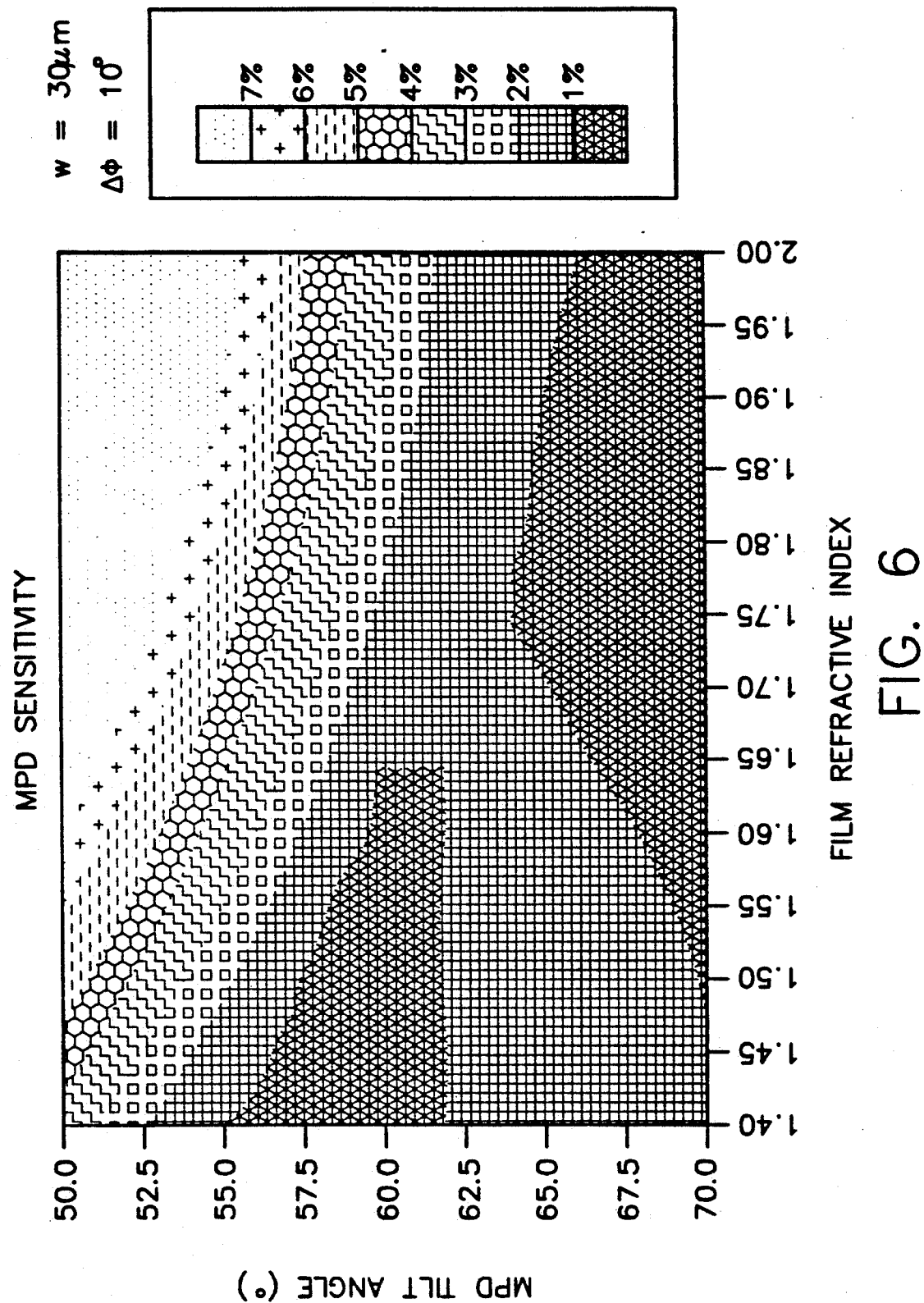
FIG. 6 is a plot illustrating the dependence of the MPD signal sensitivity on the LR film (R=10%) refractive index and MPD tilt angle for a light collection surface width of 30 μm and lateral LD beam divergence of 10°.

The following are results for the specific example of LR films with normal incidence reflectivities of 10%. For a given index of refraction, $n_2$, the film thickness is adjusted to yield the desired reflectivity. The thickness of the deposited film is allowed to vary by ±20% to simulate changes in the optical thickness with the resulting changes in the signal levels of the MPD defining the MPD signal sensitivity. This sensitivity of the MPD signal is plotted as a function of film refractive index $n_2$ and MPD tilt angle $\chi$ in FIG. 6. The performance of the MPD is much less sensitive to film thickness variations than is the laser diode itself. The darkest shaded area denotes MPD designs for which the collection efficiency varies by less than one percent for film thickness variations of ±20%. The center of this preferred region runs from an MPD tilt angle of 58° for an index of 1.4 to a tilt angle of 61° for an index of 1.6.

The magnitude of the MPD signal is of importance when selecting the design. One way to include the MPD signal magnitude with the MPD signal sensitivity in the evaluation of MPD designs is to construct a simple figure of merit equal to the ratio of the MPD signal magnitude to the MPD signal sensitivity. This figure of merit will increase as either one of these quantities improves. The functional form of the figure of merit may change with device application depending on the relative importance of the magnitude and sensitivity of the MPD signal.

Figure 7:
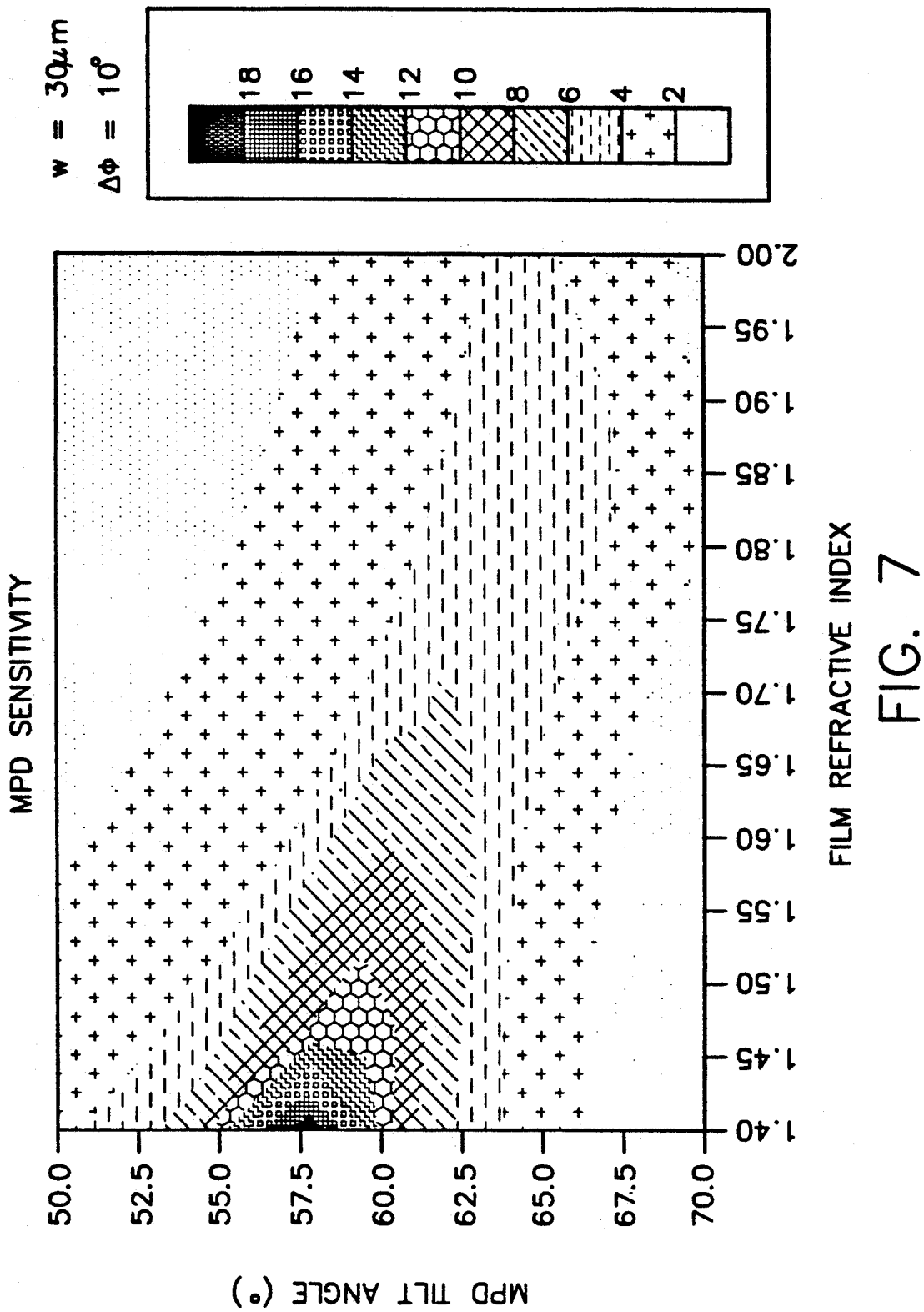
FIG. 7 is a plot illustrating the dependence of the MPD figure of merit on the LR film (R=10%) refractive index and MPD tilt angle for a light collection surface width of 30 μm and lateral LD beam divergence of 10°.
Figure 8:
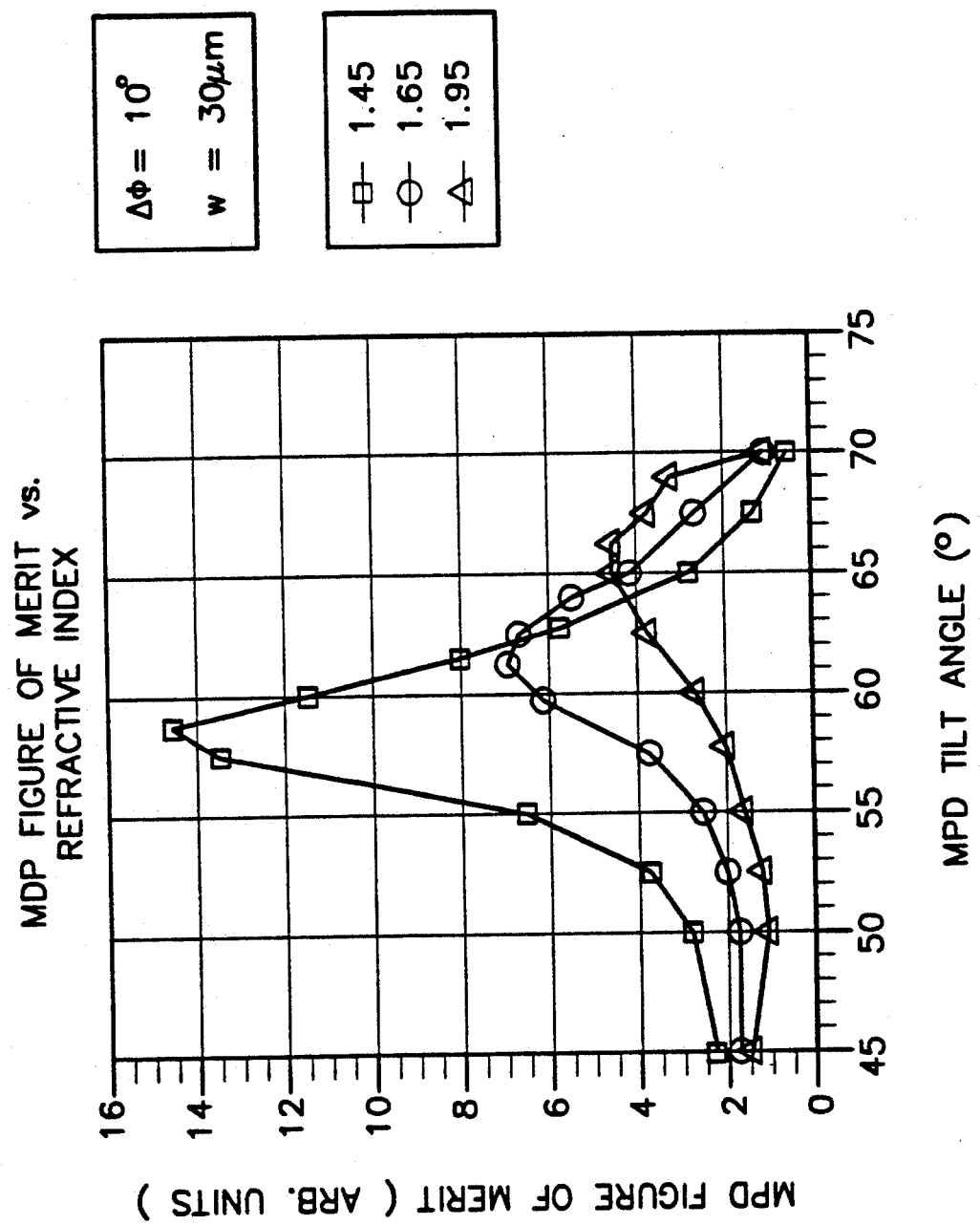
FIG. 8 plot illustrating the dependence of the MPD sensitivity on the MPD tilt angle for a variety of dielectric film refractive indices with a light collection surface width of 30 μm and lateral LD beam divergence of 10°.

The dependence of this overall MPD figure of merit on film refractive index and MPD tilt angle is shown in FIG. 7. From this plot it is evident that the optimum tilt angle for the best MPD figure of merit increases as the film refractive index increases. This effect is illustrated in FIG. 8 for the refractive indices of three common dielectrics, namely 1.45 (silicon dioxide), 1.65 (aluminum oxide) and 1.95 (silicon nitride). It is clear that using a lower index material, such as $SiO_2$, is advantageous. However, for a given dielectric material there is a range of tilt angles for which the variations in the dielectric film have minimal affect on the performance of the monitor photodetector.

The invention has been described in detail with particular reference to certain preferred embodiments thereof, but it will be understood that variations and modifications can be effected within the spirit and scope of the invention.

What is claimed is:

1. A monolithic laser diode and monitor photodetector comprising:
   (a) a substrate;
   (b) a laser diode, having an output facet and a back facet, on said substrate;
   (c) a monitor photodetector on said substrate, the light collection surface of this monitor photodetector on said substrate is placed at a tilt angle $\chi$, within a predetermined range of tilt angles from 58° to 61°, with respect to the laser diode back facet;
   (d) a dielectric coating deposited simultaneously on the output facet of the laser diode and the light collection surface of said monitor photodetector having an index of refraction from 1.4 to 1.6; and
   (e) the tilt angle being selected according to the thickness and refractive index of the dielectric coating so as to reduce the susceptibility of the photodetector performance to variations in the dielectric coating deposited simultaneously on the output facet of the laser diode and the light collection surface of the photodetector and to significantly reduce the amount of the optical power reflected from the light collection surface of the photodetector unto the laser diode back facet.

2. The monolithic laser diode and monitor photodetector of claim 1 in which the substrate is a semiconductor of either n- or p-type conductivity.

3. The monolithic laser diode and monitor photodetector of claim 2 in which the substrate is composed of GaAs.

4. The monolithic laser diode and monitor photodetector of claim 3 in which the monitor photodetector is a photodiode.

5. The monolithic laser diode and monitor photodetector of claim 4 in which the laser diode and monitor photodiode are composed of AlGaAs layers.

* * * * *